(12) United States Patent
Volant et al.

(10) Patent No.: US 6,701,779 B2
(45) Date of Patent: Mar. 9, 2004

(54) PERPENDICULAR TORSION MICRO-ELECTROMECHANICAL SWITCH

(75) Inventors: Richard P. Volant, New Fairfield, CT (US); Robert A. Groves, Highland, NY (US); Kevin S. Petrarca, Newburgh, NY (US); David M. Rockwell, Susquehanna, CT (US); Kenneth J. Stein, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/104,972

(22) Filed: Mar. 21, 2002

(65) Prior Publication Data

US 2003/0178635 A1 Sep. 25, 2003

(51) Int. Cl.[7] .................... G01P 15/00; G01P 15/08; G01P 15/13
(52) U.S. Cl. .................. 73/105; 73/514.21; 73/514.23; 73/514.32; 73/514.36; 73/514.37; 250/306; 250/307; 361/281; 334/10; 334/14; 334/78; 334/79; 334/80; 334/81; 334/82; 334/83; 334/84
(58) Field of Search .................. 334/10, 14, 78–84; 361/281; 73/105, 514.21, 514.23, 514.32, 514.36, 514.37; 250/306, 307

(56) References Cited

U.S. PATENT DOCUMENTS

| | | | |
|---|---|---|---|
| 4,855,544 A | 8/1989 | Glenn | 200/61.45 R |
| 5,786,621 A | 7/1998 | Saif et al. | 257/415 |
| 5,959,516 A | 9/1999 | Chang et al. | 334/14 |
| 5,994,982 A | 11/1999 | Kintis et al. | 333/235 |
| 6,000,280 A | 12/1999 | Miller et al. | 73/105 |
| 6,054,745 A | 4/2000 | Nakos et al. | 257/415 |
| 6,057,520 A | 5/2000 | Goodwin-Johansson | 200/181 |
| 6,073,484 A * | 6/2000 | Miller et al. | 73/105 |
| 6,114,794 A | 9/2000 | Dhuler et al. | 310/307 |
| 6,483,395 B2 * | 11/2002 | Kasai et al. | 333/105 |

* cited by examiner

*Primary Examiner*—George Eckert
*Assistant Examiner*—Joseph Nguyen
(74) *Attorney, Agent, or Firm*—H. Daniel Schnurmann

(57) ABSTRACT

A semiconductor torsional micro-electromechanical (MEM) switch is described having a conductive movable control electrode; an insulated semiconductor torsion beam attached to the movable control electrode, the insulated torsion beam and the movable control electrode being parallel to each other; and a movable contact attached to the insulated torsion beam, wherein the combination of the insulated torsion beam and the control electrode is perpendicular to the movable contact. The torsional MEM switch is characterized by having its control electrodes substantially perpendicular to the switching electrodes. The MEM switch may also include multiple controls to activate the device to form a single-pole, single-throw switch or a multiple-pole, multiple-throw switch. The method of fabricating the torsional MEM switch is fully compatible with the CMOS manufacturing process.

10 Claims, 18 Drawing Sheets

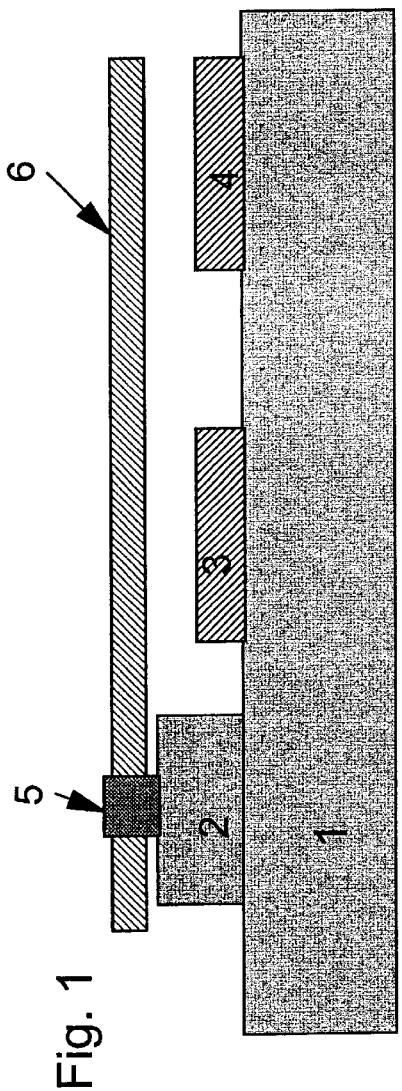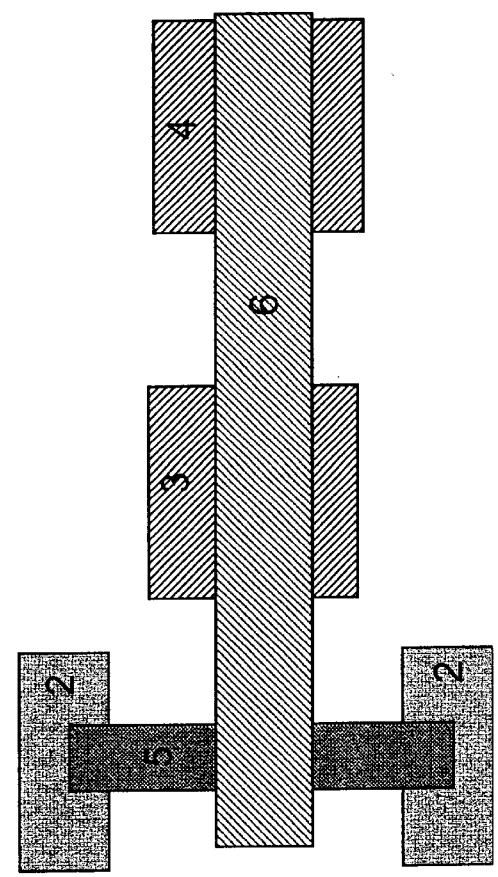

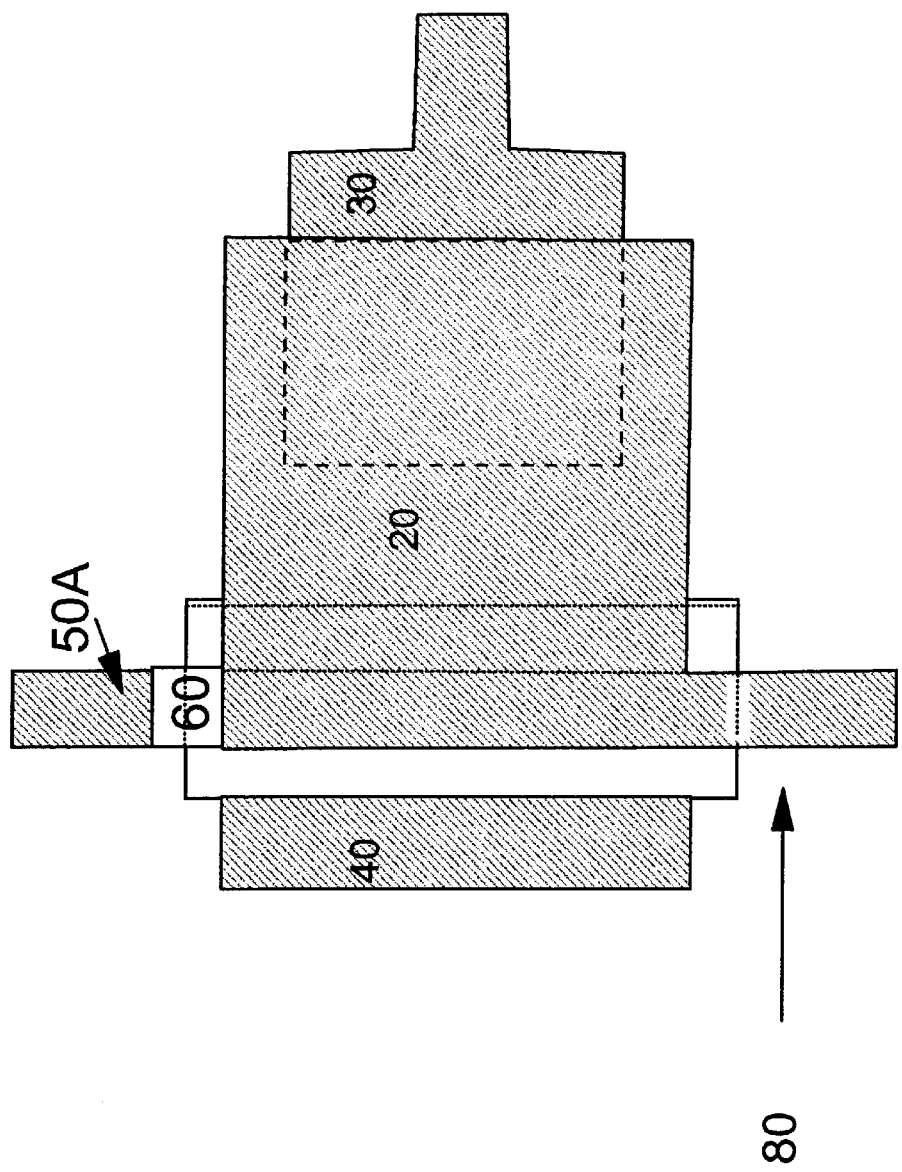

PERPENDICULAR TORSION MICRO-ELECTROMECHANICAL SWITCH

FIELD OF THE INVENTION

This invention is generally related to micro-electromechanical (MEM) switches and to a method of fabricating such structures, and more specifically, to a torsional MEM switch having the control electrodes perpendicular to the switching electrodes.

BACKGROUND OF THE INVENTION

Switching operations are a fundamental part of many electrical, mechanical and electromechanical applications. MEM switches have drawn considerable interest over the last few years. Products using MEM switch technology are widespread in biomedical, aerospace, and communications systems.

While MEM switches have been manufactured utilizing torsion beams, as described, for instance, in U.S. Pat. No. 6,000,280 to Miller et al., these devices have been typically constructed with the control surfaces parallel to the switch surface. Moreover, the materials and processing have also not been compatible with CMOS fabrication techniques.

In order to gain a better understanding of the present invention, a conventional MEM switch will now be described with reference to FIG. 1, which shows a cross-section view of a MEM switch having one end of deformable beam 5 anchored on dielectric 2. The lowest level is made of dielectric material 1 consisting of conductive elements 3 and 4 which are used to connect or form the various electrical components of the device. The conductors referenced by numerals 3 and 6 are used to provide an operating voltage potential that causes the beam to deform. Conductor 4, which conducts a signal is, in turn, connected to the beam when the MEM switch is in operation. FIG. 2 shows a top-down view of the same conventional switch.

In a typical implementation of a prior art MEM switch, a contact beam 6, is formed by polysilicon over a dielectric layer made of, e.g., SiO$_2$. The surrounding material is etched away leaving a raised structure attached to silicon beam 5. The contact beam 6 suspended above conductors 3 and 4 that were previously formed is preferably made of polysilicon. Subsequently, the device is subjected to electroless plating, usually of gold, that adheres to the polysilicon forming conductive elements 3, 4 and 6.

The switch operates by providing a voltage difference between contact beam 6 and electrode 3. This voltage generates an electrostatic attraction that brings beam 6 in contact with electrode 4, thus closing the switch. The twist imparted to the anchored beam 5 is used to restore contact 6 to its open position once the control voltage potential is dropped.

Generally, all conventional raised structures are characterized by extending over a very large area when it is compared to conventional semiconductor devices. This, in itself, makes them virtually impossible to integrate into the semiconductor chip fabrication process.

OBJECTS OF THE INVENTION

Accordingly, it is an object of the invention to provide a torsional MEM switch having its control electrodes substantially perpendicular to the switching electrodes.

It is another object to provide electrical isolation between the control signal and the switched signal by separating the contacts by a dielectric.

It is further an object to provide a torsional MEM switch with multiple controls for opening and closing the switch.

It is yet another object to provide MEM switches in a variety of multi-pole, multi-throw arrangements.

It is still another object to provide a MEM switch having a greatly reduced overall switching area needed to make good contact between the electrodes, while still maintaining good electrostatic control.

It is still a further object to provide a method of fabricating a MEM switch using manufacturing techniques that are compatible with those applicable to CMOS semiconductor devices.

SUMMARY OF THE INVENTION

In one aspect of the invention, the overall switch area of the MEM switch that is required to make good contact and provide the necessary electrostatic controls is greatly reduced by placing the controls in a direction perpendicular to the switch contacts. This not only moves the control surface area in a perpendicular direction, but it also shortens the length of the beam due to the added leverage gained in the perpendicular arrangement. The same leverage lowers the control voltage requirements since the spacing between the control electrodes can be reduced without downsizing the spacing between the signal electrodes.

In another aspect of the invention, the problem occurring in MEM switches known as stiction (i.e., the tendency for surfaces making contact to stick together and not release when the control voltage is dropped) is greatly reduced. The inventive MEM switch addresses this problem by having opposing control surfaces supply the necessary attraction in either direction, thus overcoming stiction.

In still another aspect of the invention, isolation of the control signal from the switching signal is provided. The inventive MEM switching device physically and electrically isolates the two conducting paths. It also provides an added isolation by significantly increasing the spacing between the signal electrodes by rearranging the various elements forming the MEM switch. The invention further provides for single and multiple pole devices.

In yet another aspect of the invention, there is provided a semiconductor MEM switch that includes: a conductive movable control electrode; an insulated semiconductor torsion beam attached to the movable control electrode, the insulated torsion beam and the movable control electrode being parallel to each other; and at least one movable contact attached to the insulated torsion beam, wherein the combination of the insulated torsion beam and the control electrode is perpendicular to the movable contact.

BRIEF DESCRIPTION OF THE DRAWINGS

These and other objects, aspects and advantages of the invention will be better understood from the detailed preferred embodiment of the invention when taken in conjunction with the accompanying drawings.

FIG. 1 shows a cross-section view of a conventional MEM switch.

FIG. 2 is a top-down view of the same prior art MEM switch shown in FIG. 1.

FIG. 5 illustrates an embodiment of the invention showing how the movable electrode is configured to provide electrical contact in a SPST (single-pole, single-throw) MEM switch.

DETAILED DESCRIPTION OF THE INVENTION

The present invention will now be described more fully, hereinafter with reference to the drawings, in which preferred embodiments are shown.

Figure 3:
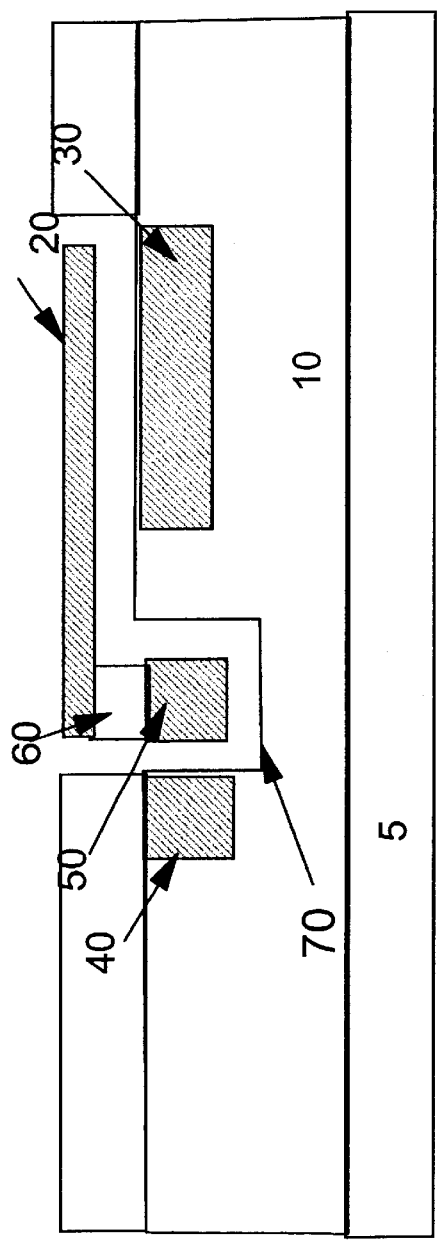
FIG. 3 is a cross-section view of the functional MEM torsion switch according to the invention, seen at a cut through the lines A—A shown in FIG. 4.
Figure 4:
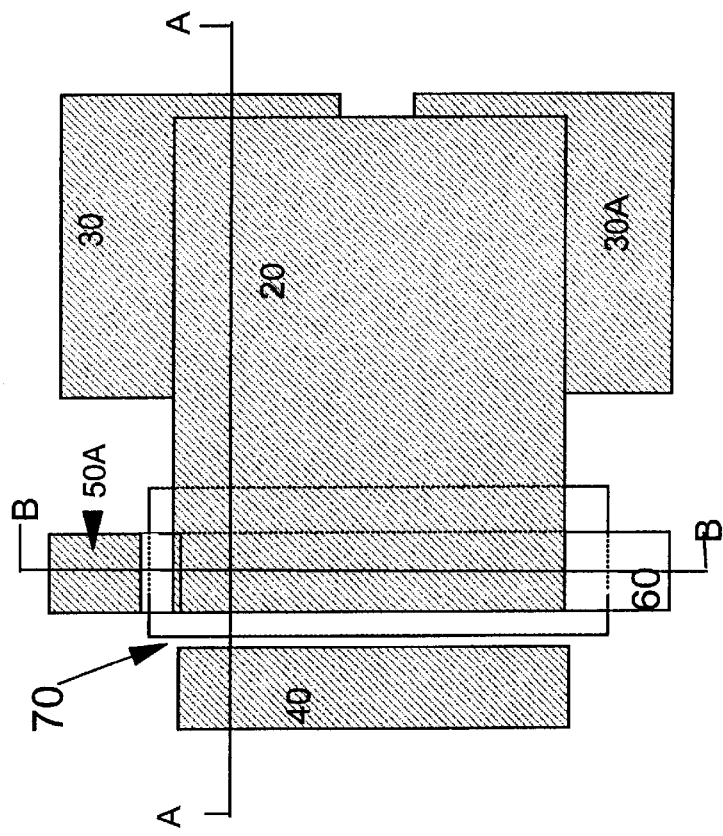
FIG. 4 is a top-down view of the device shown in FIG. 3, according to the present invention.

FIG. 3 shows a cross-section of a perpendicular torsion MEM switch seen through a cut defined by line A—A of FIG. 4. The device is built on substrate 5 upon which a ceramic, glass, silicon, or any insulating or semi-insulating material layer is deposited. The thickness of layer 10 is determined by the overall size of the MEM switch to be fabricated, preferably, approximately 2 $\mu$m thick. Metal connections and electrodes of the switch are shown inserted within the dielectric, as it is typically done in a semiconductor fabrication process commonly known as a Damascene process. In the preferred embodiment, the metal is, preferentially, copper with a suitable liner and barrier material. Metal conductors 30, 40 and 50 are approximately 1 $\mu$m thick. The conductor 30 is illustrative of a contact pad wherein current or signals pass through when the movable contact 20 is activated to close the switch. The area of pad 30 varies significantly, and is typically of the order of 10 $\mu$m$^2$. The length of the beam structure is also variable, ranging from 20 $\mu$m to over 200 $\mu$m. The attractive force between the control electrodes depends on the respective areas of parallel surfaces. The area of electrode 40 ranges from 0.5 to 1 $\mu$m$^2$, although its dimensions may vary by making it deeper or longer in order to better conform with the area of electrode 50. A trench 70 is constructed surrounding electrode 50 and torsion beam 60 upon which the moveable electrode, referenced by numeral 20, is anchored. The trench provides the necessary space for the electrode to move about when voltage is applied between electrode 50 and stationary electrode 40. When this occurs, electrode 50 is attracted towards electrode 40. The moveable electrode 50 is suspended from and attached to the dielectric beam 60 which is anchored on at least one end to the dielectric (see FIG. 6A, layers 11 and 12). The attraction between the two control electrodes 40 and 50 causes beam 60 to torque or twist as electrode 50 is pulled toward 40. The moveable contact 20 is also attached to dielectric beam 60, causing it to rotate when contacting plate 30. (This will be further illustrated with reference to FIGS. 9 and 10A that show another embodiment of the invention). Electrode 40 can be exposed to the trench on one side or set in such a way that a thin layer of dielectric prevents physical contact between the two control electrodes. Preferably, a thin layer of dielectric, of the order of 200–500 Å, precludes them from touching each other If contact is made, a delta in potential is lost and the switch may fluctuate. Alternately, the moveable electrode 50 can be isolated by depositing a thin layer of dielectric on its sides.

FIG. 4 is a top down view of the MEM switch according to the invention. The device is built within the substrate or on a dielectric layer deposited on top of the substrate FIG. 4 illustrates the case where movable contact 20 connects two substantially co-planar contacts 30 and 30A. A metal connection 50A provides an electrical path to the control electrode 50. (This will be illustrated in greater detail when describing FIG. 6A). A cavity 70 is formed in the dielectric or substrate within which control electrode 50 of the torsion beam 60 is free to move. The corresponding control electrode 40 is formed within the dielectric in a direction parallel to the moveable beam electrode 50. When a voltage differential is applied between electrodes 40 and 50, an electrostatic force attracts moveable electrode 50 towards stationary electrode 40, causing torsion bar 60 to deform and twist. When the torsion bar deforms, it forces the attached signal electrode(s) 20 to rotate, coming into contact with stationary signal electrode 30 and closing the switch.

The MEM device is also configured such that by closing the MEM switch, contact 20 allows an electrical signal to pass through electrode 30A and 30. Other combinations are possible.

FIG. 5 shows another embodiment of the invention wherein movable contact 20 allows current or a signal to pass directly from and to the stationary contact 30. In this case, connection 80 is shown making contact with movable electrode 20.

Figure 6A:
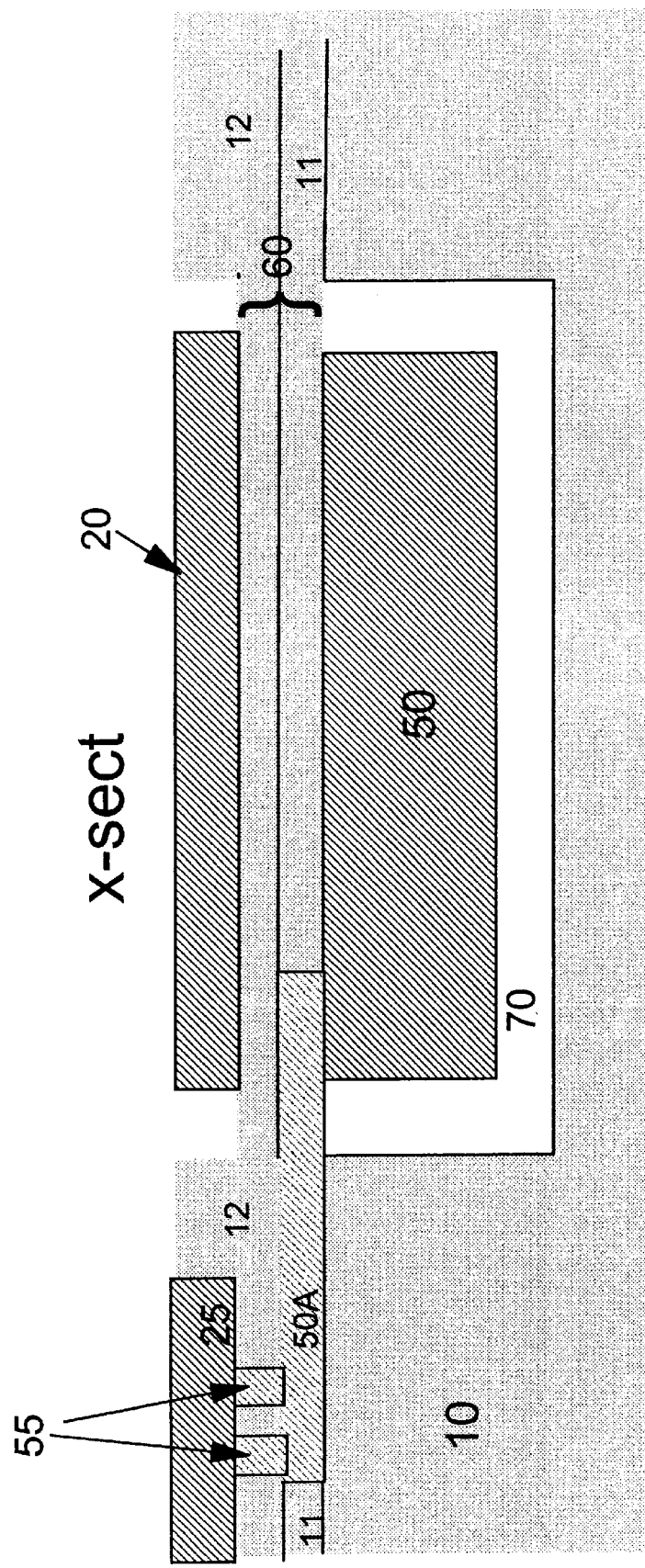
FIG. 6A shows a cross-section of the device seen from a cut through line B—B of FIG. 4.

FIG. 6A is a cross-section of the device through the line B—B shown in FIG. 4. Herein, a connection is shown extending from electrodes 50 to 50A, from 50A to vias 55, and from there to upper pad 25. The beam 60 is made by way of dielectric layers 11 and 12 and from metal connection 50A. It is anchored on both ends to the respective layers. Electrode 50 is attached to contact 25 through vias 55. Cavity 70 provides space for electrode 50 to freely move. For clarity sake, the stationary control electrodes are not shown. The movable electrode 50 is suspended in cavity 70 and coupled to torsion beam 60. An electrical connection to electrode 50 is made through conductor 50A, through conductive vias 55 to the upper contact 25. Dielectric surrounding torsion beam 60 isolates the control electrode 50 from signal electrode 20. (The stationary control electrodes are not shown).

Figure 6B:
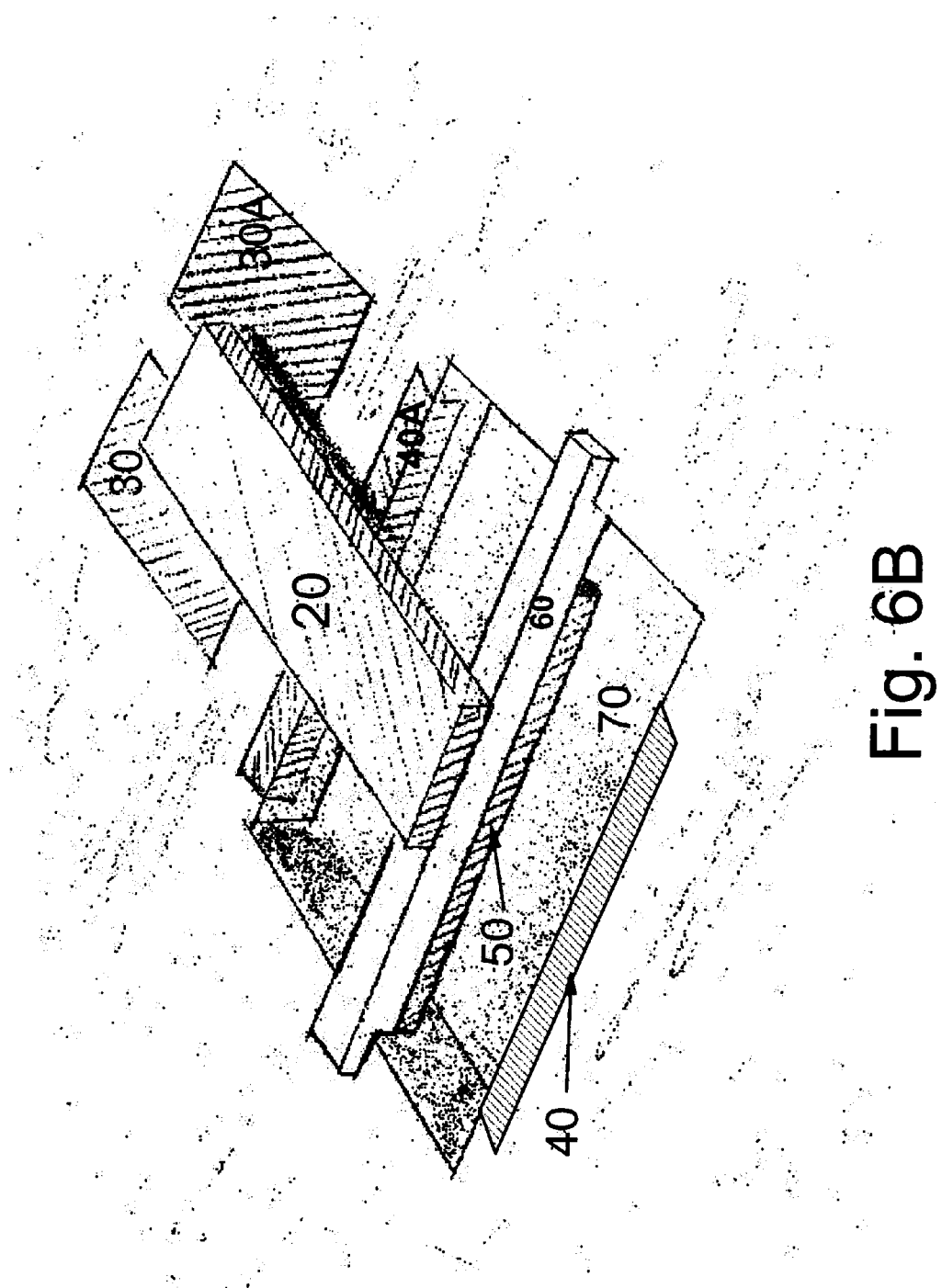
FIG. 6B is a perspective view of the MEM switch, according to the invention.

To gain a better understanding of the MEM switch of the invention, FIG. 6B illustrates a perspective view of the switching device, specifically showing electrode 50 anchored at one end of cavity 70 supporting torsion beam 60, where in combination with electrode 50 support is provided to movable contact 20 positioned perpendicularly to 50 and 60. When fully deflected, contact 20 shorts contacts 30 and 30A.

Figure 7:
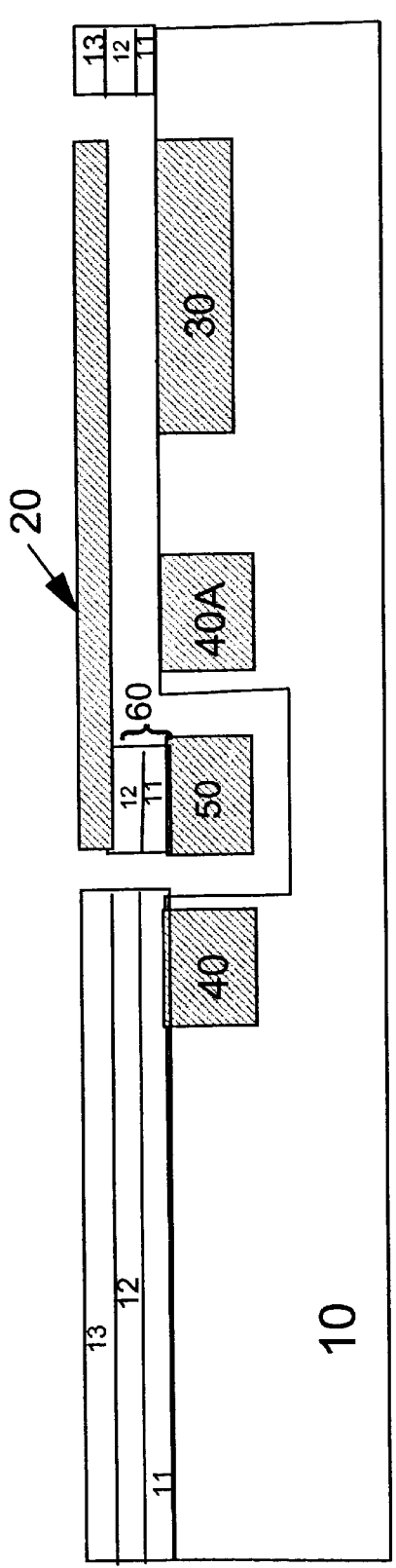
FIG. 7 illustrates how by adding an opposing electrode, an electrostatic force is provided which restores the MEM switch to its open position.

FIG. 7 shows how by adding an electrode 40A symmetrically positioned to electrode 40 with respect to electrode 50, an attractive force in an opposing direction is provided to open the switch. This feature is of critical importance if the switch remains stuck in a closed position when the normal torsion of the beam is unable to restore it back to its open state. If, for instance, the switch is stuck in a closed position as a result of the control surfaces sticking together or because the signal contacts come into contact with each other when the voltage between electrodes 40 and 50 drops, then a voltage applied between 50 and 40A will pull the control electrode 50 back to its opened position. This arrangement can also be constructed in a manner which allows for shunting two or more stationary electrodes previously described, or as a series switch, similar to FIG. 5. If, for instance, referring to FIG. 5 a complementary control electrode similar to 40 is positioned on the opposite side of the cavity, then, this electrode may be used to pull the switch to its open position. This is illustrated in the cross-section of the device shown in FIG. 7. This arrangement can also be used to overcome stiction since one control may be used to pull the movable beam down while the second pulls it up.

Figure 8:
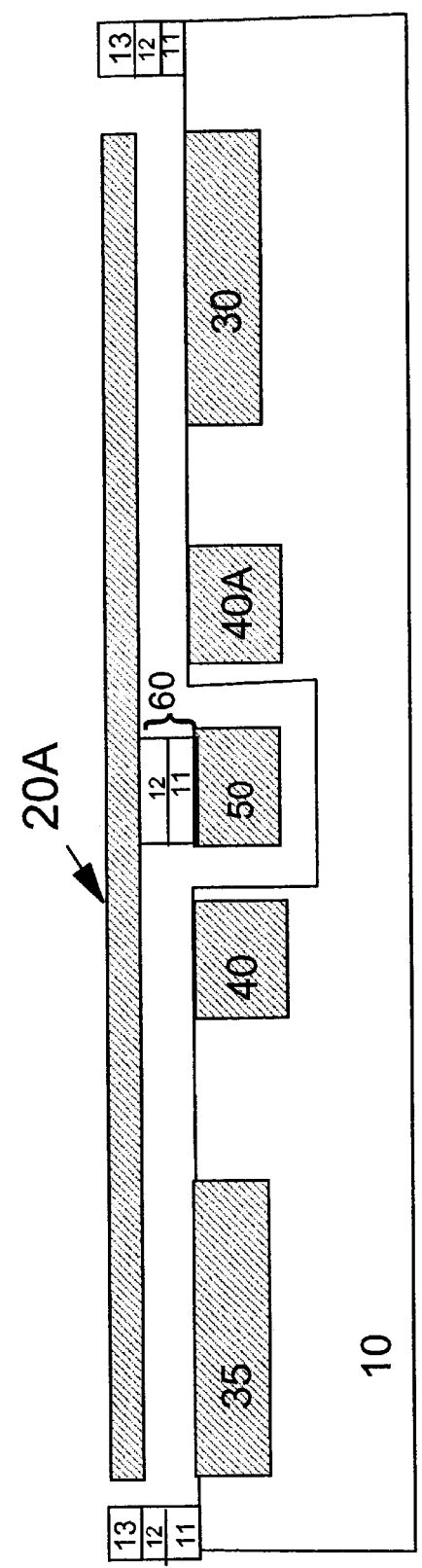
FIG. 8 shows an embodiment of a torsion MEM switch configured as a single-pole, double-throw switch. It also shows how by extending the movable contact over the two sides, a multi-position MEM switch configuration is achieved.

FIG. 8 shows an expanded switch configuration based on the switch illustrated in FIG. 7. Therein is shown in addition to the dual control, a movable contact 20A extending over both sides of the structure to form a multi-position switch, i.e., a multi-throw or single pole, double-throw switch. This arrangement provides the same advantages stated earlier for restoring the switch to the open state. In addition, there is an added advantage by providing added functionality when the switch is used as a single-pole, double-throw or even multi-pole, double throw switch.

Figure 9:
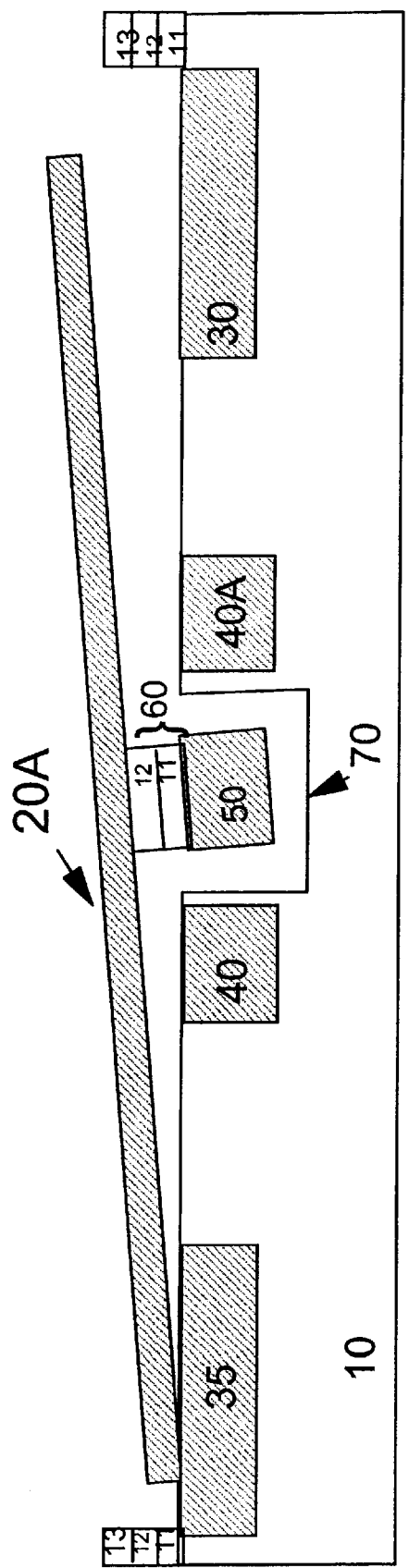
FIG. 9 illustrates how by applying a voltage between electrode 40A and control electrode 50, movable contact 20A contacts the stationary electrode 35, opening the opposing electrode 30.
Figure 10A:
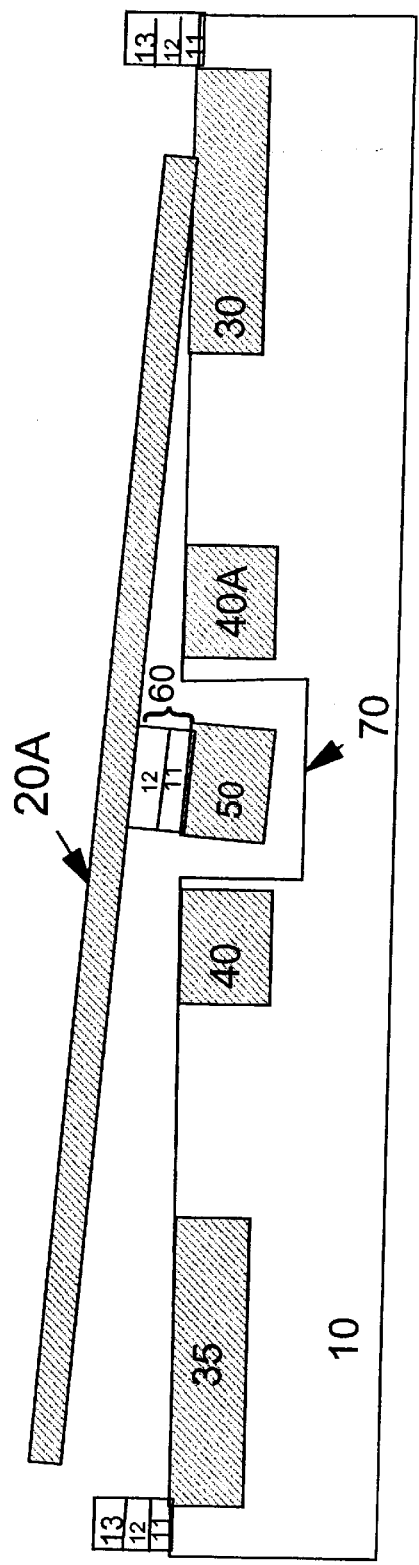
FIG. 10A illustrates a complementary version of the MEM switch wherein the movable contact 20A makes contact with electrode 30, opening stationary electrode 35 and moving it away from contact 20A when a voltage is applied between electrodes 40 and 50.

FIGS. 9 and 10A illustrate the two modes of operation. In FIG. 9, a control voltage is applied between electrodes 50 and 40A which deforms beam 60, closing contacts 35 and 20A. FIG. 10A shows the opposite condition where a voltage is applied between electrodes 40 and 50.

Figure 10B:
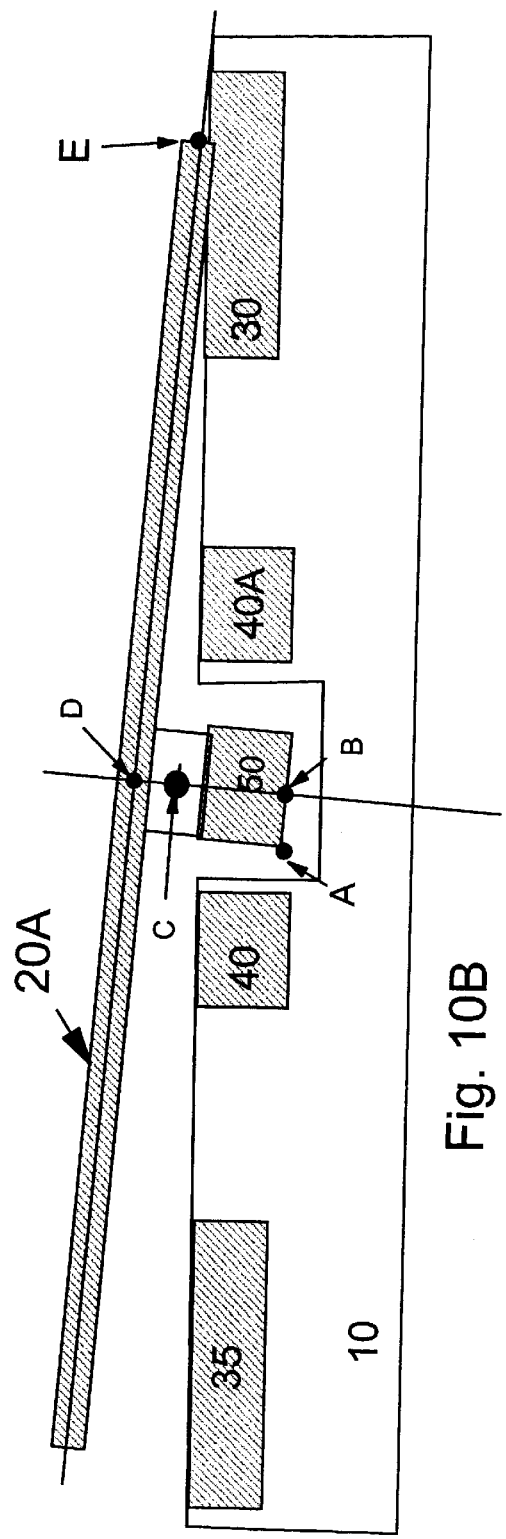
FIG. 10B illustrates an example of how the perpendicular control provides leverage to shorten the length of the movable beam.

FIG. 10B illustrates an example of how the perpendicular control provides leverage to shorten the required beam. If the distance between points A and B is, e.g., 0.5 $\mu$m, and the distance from B to C is, e.g., 1.5 $\mu$m, then, when the control surface 50 moves 0.5 $\mu$m, point D will move 0.3 $\mu$m (the pivot point being C). In turn, if the beam is only 5 $\mu$m long, then the end of the beam, i.e., point E, will move 2 $\mu$m.

Figure 11:
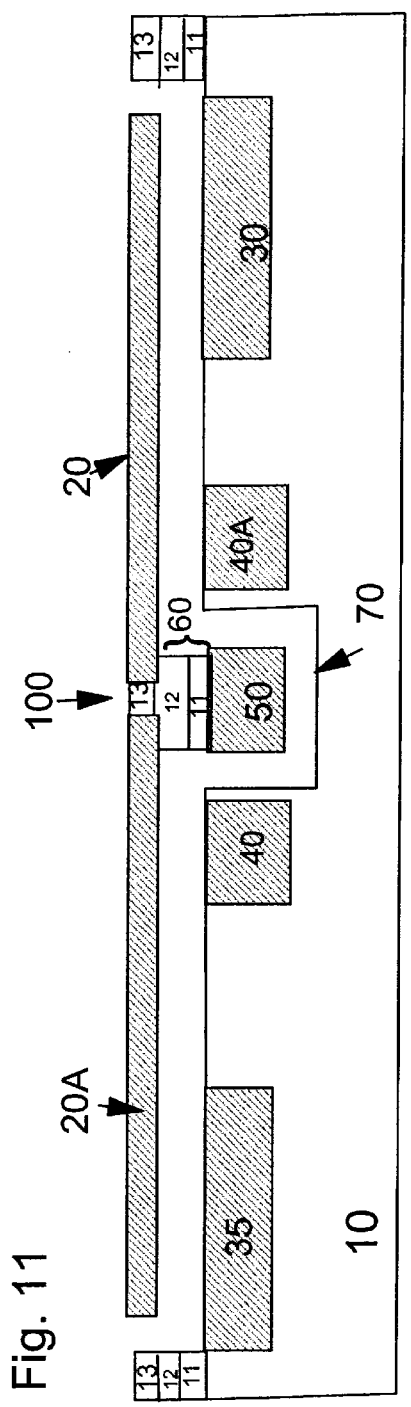
FIG. 11 shows another embodiment of the invention showing two movable contacts that are electrically isolated from one another.

FIG. 11 is still another embodiment of the invention wherein the movable contact is split into two or more contacts, 20 and 20A, separated by spacer 100, which preferably consists of a section of dielectric layer 13, to allow multi-position, multi-throw switching by making contact, respectively, with stationary contacts 30 and 35.

Figure 12:
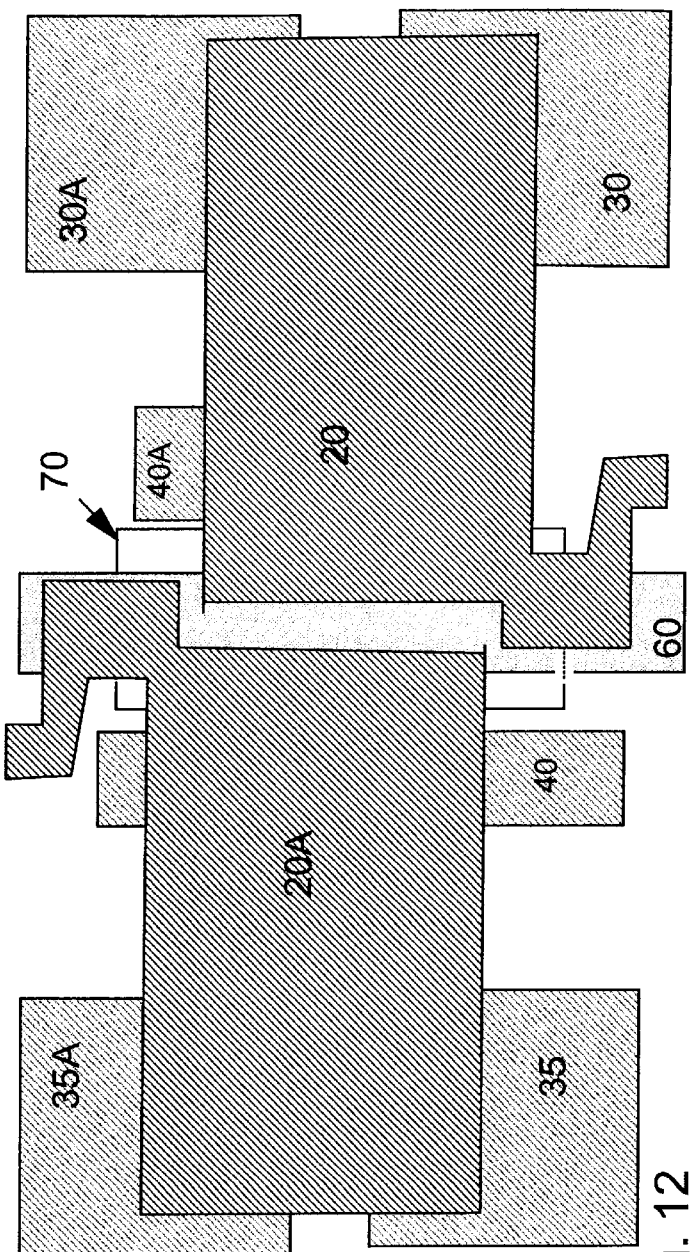
FIG. 12 provides a top-down view of the device shown in FIG. 11.

FIG. 12 shows the top-down view for FIG. 11. The size of the various components varies in accordance to their specific application. Some nominal dimensions are as follows: contacts 20 and 20A are each of the order of 50 $\mu$m wide and 100 $\mu$m long. The width of the beam 60 and its associated components (i.e., 50) are about 10 $\mu$m, and its length over the cavity is 80 $\mu$m. The thickness in the z-direction ranges between 4–10 $\mu$m. The width of cavity 70 varies between 52 and 55 $\mu$m and its length is approximately 80 $\mu$m long. Its depth is slightly larger than that of the beam including its components to provide adequate movement. Control electrodes 40 and 40A are, typically, 5 $\mu$m wide, 4 $\mu$m deep and 50–80 $\mu$m long. The dimensions of the stationary contacts (30, 30A, 35 and 35A) are not critical to the operation of the device but depend on the application of the device it is used for. Hence, for higher power applications, the contacts are larger if the layout permits it in order to maximize the contact area. Finally, the separation of the contacts is a function of how much isolation is required for the application it is constructed for.

Figure 13:
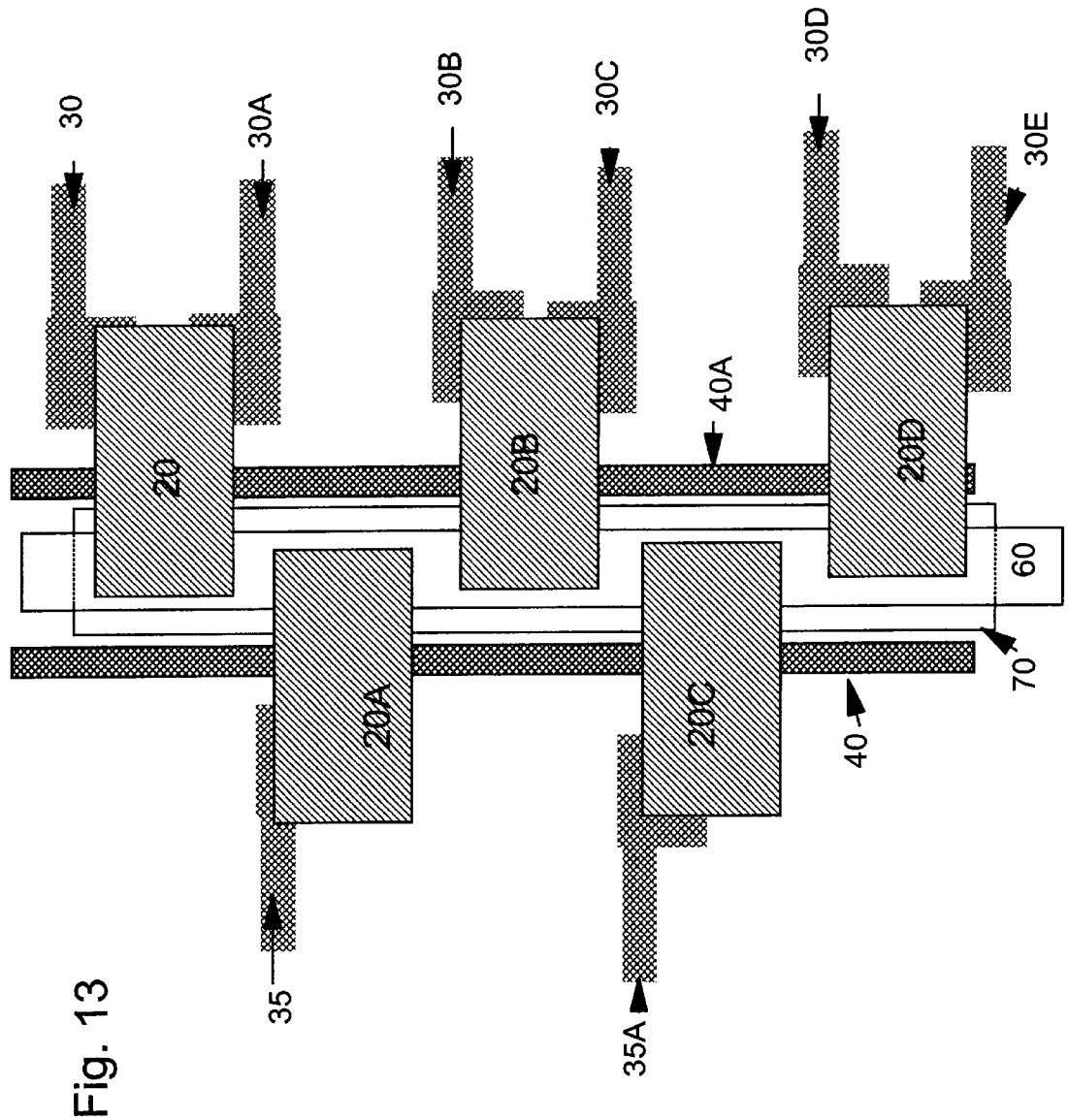
FIG. 13 illustrates one of several variations that are derived from the first embodiment of the torsion MEM switch. Herein, five MEM switch are shown connected in a single switch configuration.

FIG. 13 illustrates how this concept is extended to a plurality of contacts servicing one beam. Therein are shown movable contacts 20, 20A, 20B, 20C and 20D attached to the top of torsion beam 60. Control electrodes 40 and 40A are coupled to movable electrode 50 (not shown). Thus, stationary electrodes 30 and 30A are linked by movable contact 20; stationary electrodes 30B and 30C are linked by 20B; and stationary electrodes 30D and 30E by movable contact 20D. When the switch operates in the opposite mode, then stationary contacts 35 and 35A are contacted, respectively, by 20A and 20C. Practitioners in the art will realize that other variations are possible with the structure being described. For instance, moveable electrodes 20A and 20C can be formed in such a way as to have them electrically connected to the beam such that when the electrodes are electrically connected to stationary contacts 35 and 35A it forms a closed circuit between them.

FIGS. 14–23A illustrate the process flow for building a torsional MEM switch, in accordance with the invention. The device shown in FIG. 11 will be selected to describe the process manufacturing steps associated with the construction of such devices. The same or a similar process may be used to construct all the various configurations described with reference to the various embodiments of the MEM switches. As previously stated, the processes may be performed directly on a semiconductor substrate or, alternatively, on a substrate insulated by a dielectric layer deposited on the substrate.

Figure 14:
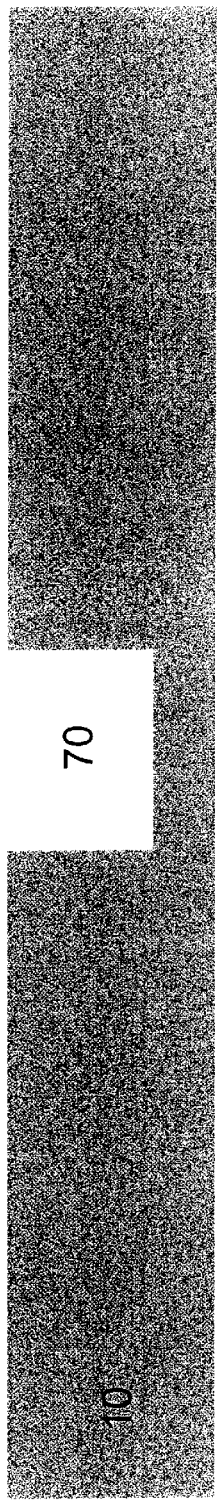
FIGS. 14 through 27 illustrate the various fabrication process steps, with particular emphasis on how they are fully integrated in a standard CMOS fabrication facility.

FIG. 14 shows a layer 10 of dielectric material on top of the substrate (not shown) that is patterned and etched to form at least one trench area 70. The dielectric is, preferably, made of $SiO_2$, although other dielectric materials such as silicon nitride, BPSG (boro-phosphosilicate glass) can be advantageously used. The trench is patterned using standard semiconductor processing techniques, known in the art. The etching is performed by way of a standard etch process tailored to the specific material used as dielectric. The thickness of the dielectric layer depends upon the desired depth for the trench., varying from 5000 Å to several microns thick. Preferably, the thickness ranges from 1 to 4 $\mu$m, and extend from 4000 Å to several microns deep.

Figure 15:
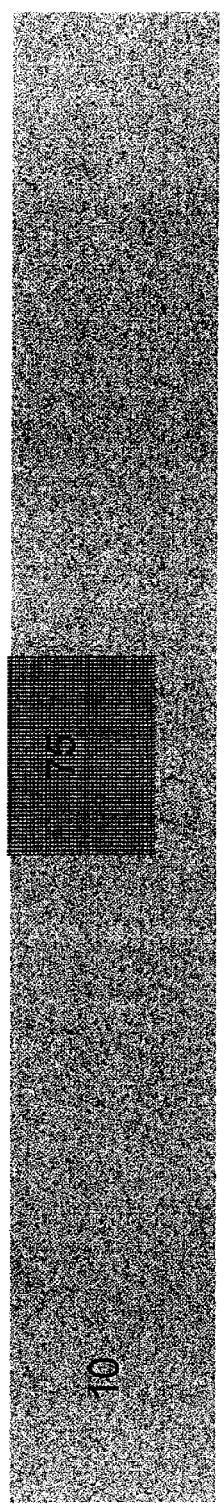

FIG. 15 shows trench(es) 70 filled with a sacrificial release material 75 and planarized. To this end, any number of compounds can be used, such as photoresist, polyimide, DLC (diamond like carbon) or SiLK (manufactured by DuPont Chemicals, Inc). SiLK is a semiconductor dielectric in the form of a polymer resin comprised of gamma-butyrolactone, B-staged polymer and mesitylene. DLC, which is an amorphous carbon containing coating wherein a proportion of the carbon atoms are bonded in a manner similar to diamond and which resembles in many ways to diamond. Diamond-like carbon is produced when carbon is deposited under an energetic bombardment. The instantaneous localized high temperature and pressure induce a proportion of the carbon atoms to bond as diamond. These conditions are obtained during plasma assisted chemical vapor deposition (PACVD). The deposition is done with carbon containing gas, such as acetylene, which is introduced to provide the energetic carbon ions. Polymers can typically be spin applied and then planarized using CMP (chemical mechanical polish). In the preferred embodiment we illustrate the use of SILK as the release material. Other materials can also be used provided they are selected according to the requirements of the release process. Similar to bulk silicon micro-machine techniques, wherein different dielectric such as $SiO_2$, $Si_3N_4$ and doped oxides are used in conjunction with wet etching in potassium hydroxide.

Figure 16:
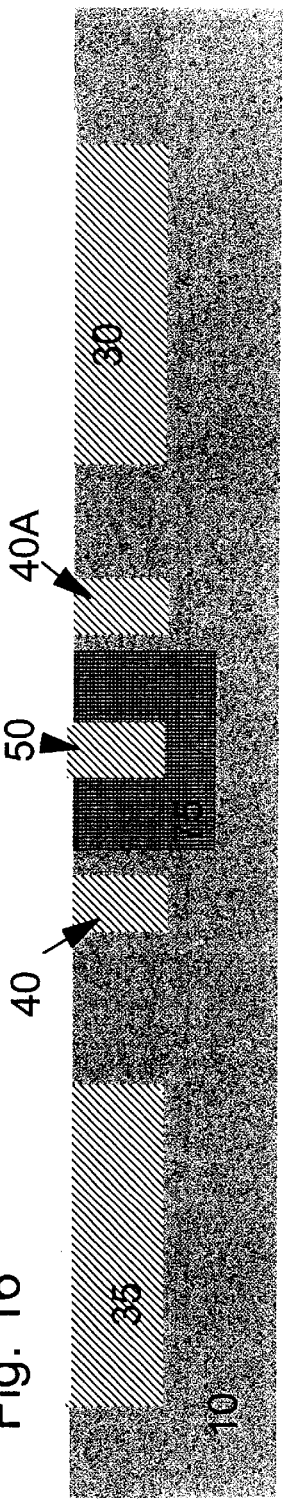

FIG. 16 illustrates how the metal contacts and electrodes are formed using a standard CMOS Damascene process. This makes it possible to form the lower connections, i.e., stationary contacts and control electrodes, 30, 35, 40, 40A and 50 which are all made simultaneously. The material used is preferably copper with TaN and Ta liners. Other similar materials are also suitable.

Figure 17:
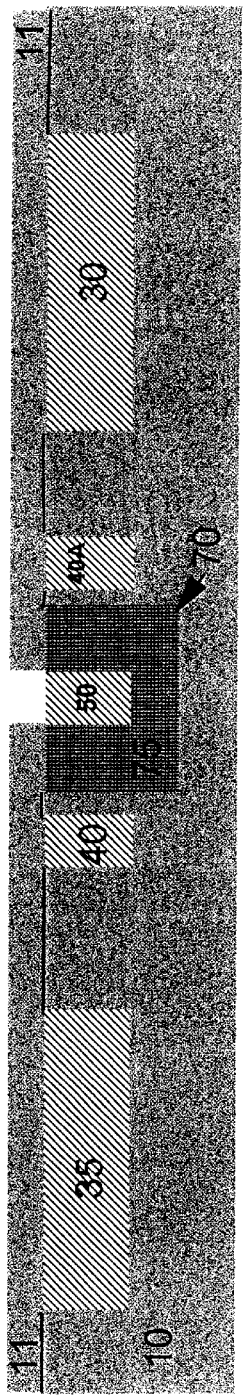
Figure 18:
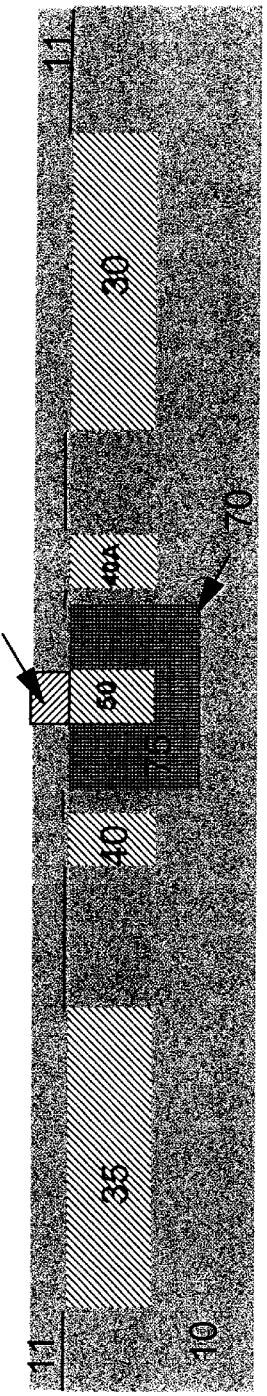

FIG. 17 shows a second layer of dielectric 11 deposited and patterned to accept metal to form the interconnect 50A (to the electrode 50 in FIG. 18). This dielectric layer is again made of $SiO_2$ or other similar dielectric material.

FIG. 18 illustrates the interconnect 50A in dielectric 11. The metal interconnect is formed using standard semiconductor processing and, preferably, is made of copper, aluminum, tungsten, and the like. (Note: element 75 in FIG. 18 is the release material filling cavity 70 shown in FIG. 6A. Further, element 50A, in both figures, may or may not be the entire length of the beam 60, as long as it makes electrical contact to element 50).

Figure 19:
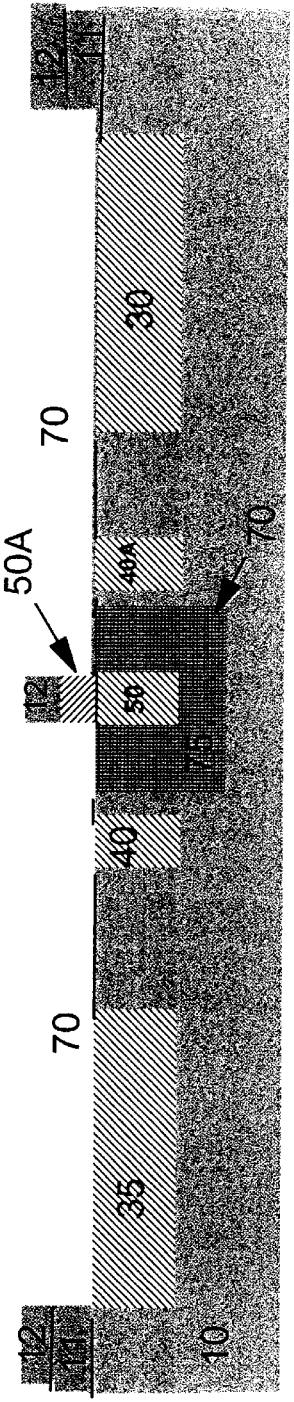

FIG. 19 shows the addition of another dielectric layer 12, which combined with the previous dielectric 11 provides for the full depth of the cavity 70 within which the moveable beam will be able to move. Layer 12 is patterned and etched for this cavity as well as any necessary vias 55 (FIG. 6A) that will be required to contact the prior metal layers, and especially to the interconnect 50A.

Figure 20:
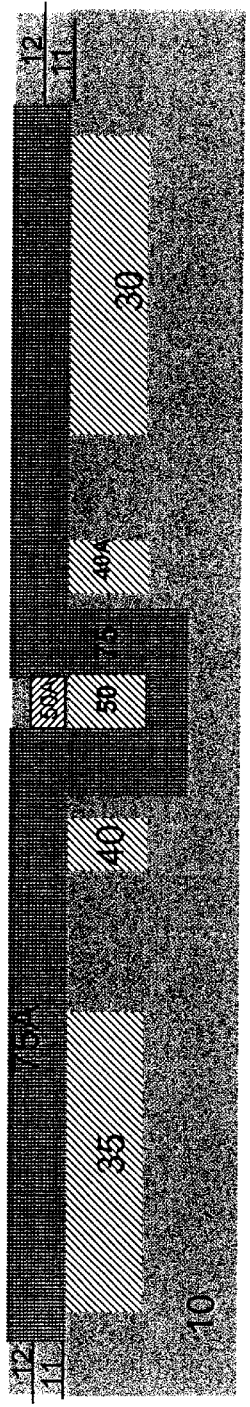

FIG. 20 illustrates the cavity 70 being filled with the same sacrificial material 75A similar to the one that was used earlier, i.e., release material 75 filling cavity 70, shown in FIG. 15. The sacrificial material is planarized using CMP or patterned and etched, so as to be substantially planar with dielectric layer 12.

Figure 21:
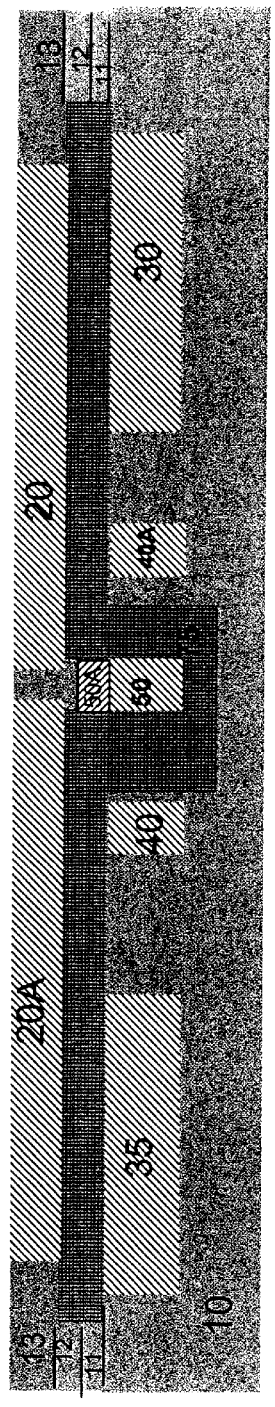

FIG. 21 shows yet another layer of dielectric 13 added on top of the previous structure. Within this layer, the upper switch contacts 20 and 20A are built according to the copper Damascene process used in the art.

Figure 22:
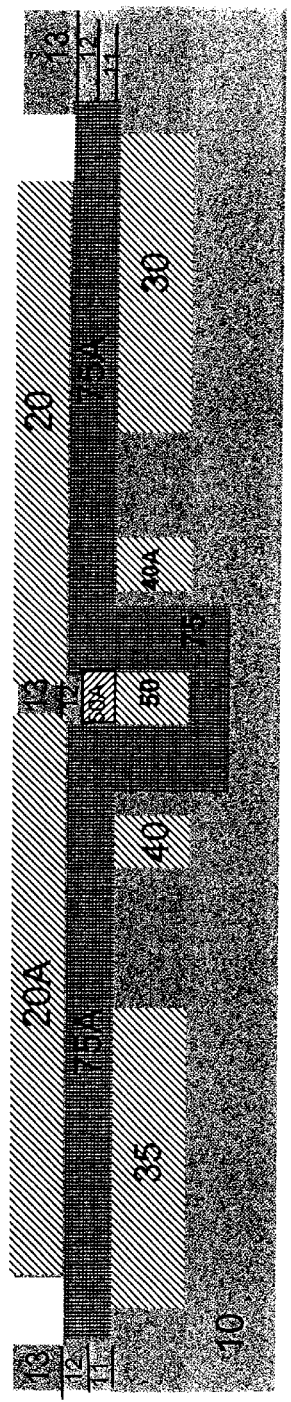

FIG. 22 illustrates the patterning and etching of dielectric layer 13 around beam 60 and upper contacts 20 and 20A in order to release the beam and the contacts in the required areas, and provide access to the release material 75 and 75A below.

Figure 23A:
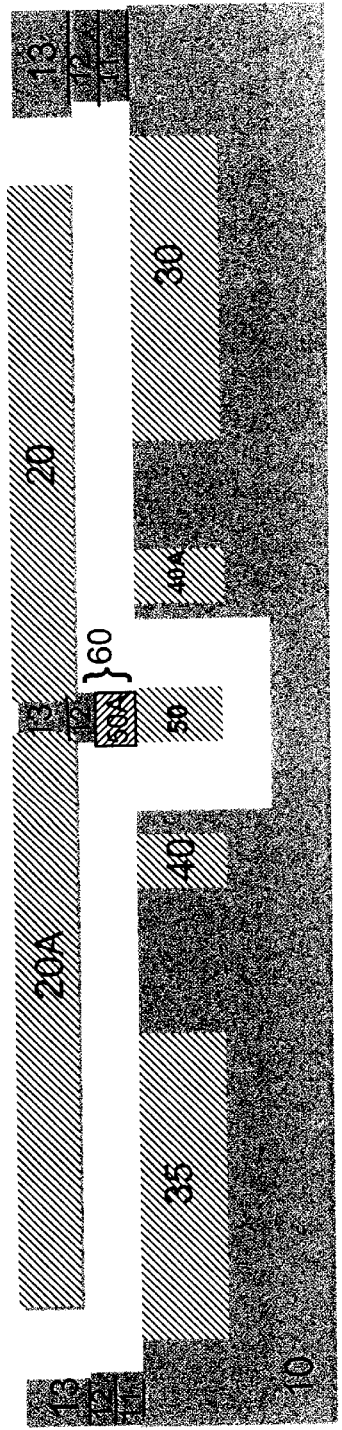
Figure 23B:
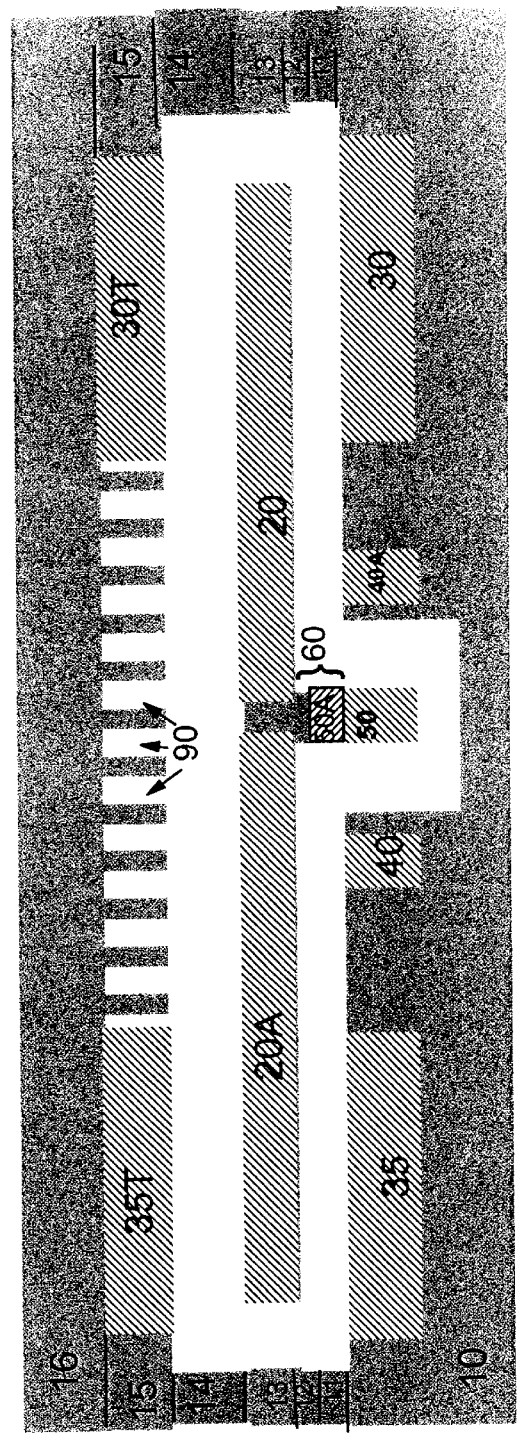

FIG. 23A shows the structure after selectively removing sacrificial release material 75 and 75A through the access described in FIG. 22. More specifically, these materials can be removed by way of oxygen plasma exposure if there is no oxidizable material that is exposed. If an oxidizable material is exposed during the removal of the organic material, then an $H_2/CO_2/CO/N_2$ type plasma removal may be advantageously used. These gas mixtures will be recognizable to practitioners skilled in the art of reactive ion etching FIG. 23B illustrates another embodiment of the MEMS device which includes additional stationary contacts 35T and 30T formed above moveable contacts 20A and 20. These added features will be further explained with particular reference to FIG. 25.

FIGS. 24–27 depict an alternate method for building the structure in such a manner as to provide integral encapsulation of the device to protect it from the outside world.

Figure 24:
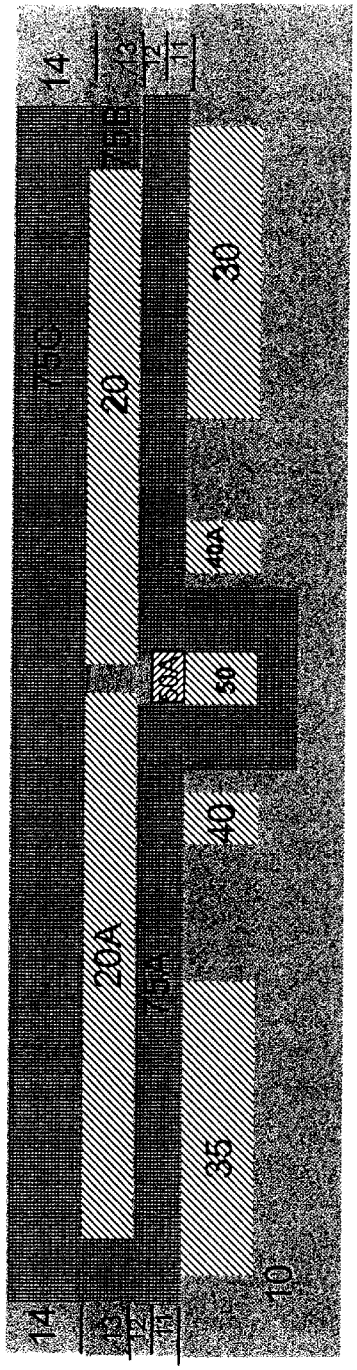

More specifically, FIG. 24 shows the process step following FIG. 21 when an alternate method is used. In this sequence, another dielectric layer 14 is added, followed by patterning appropriate areas and etching out a cavity above the beam and areas surrounding the beam. The resulting voids are filled with sacrificial material, i.e., by a combination of 75B and 75C.

Alternatively, and referring to FIG. 22, areas etched out are filled with sacrificial material 75B, and are then planarized. Dielectric layer 14 is added. The cavity above the beam and the moveable contacts are formed and filled with release material 75C, as previously described. Finally, the structure is rendered substantially planar with dielectric layer 14.

Figure 25:
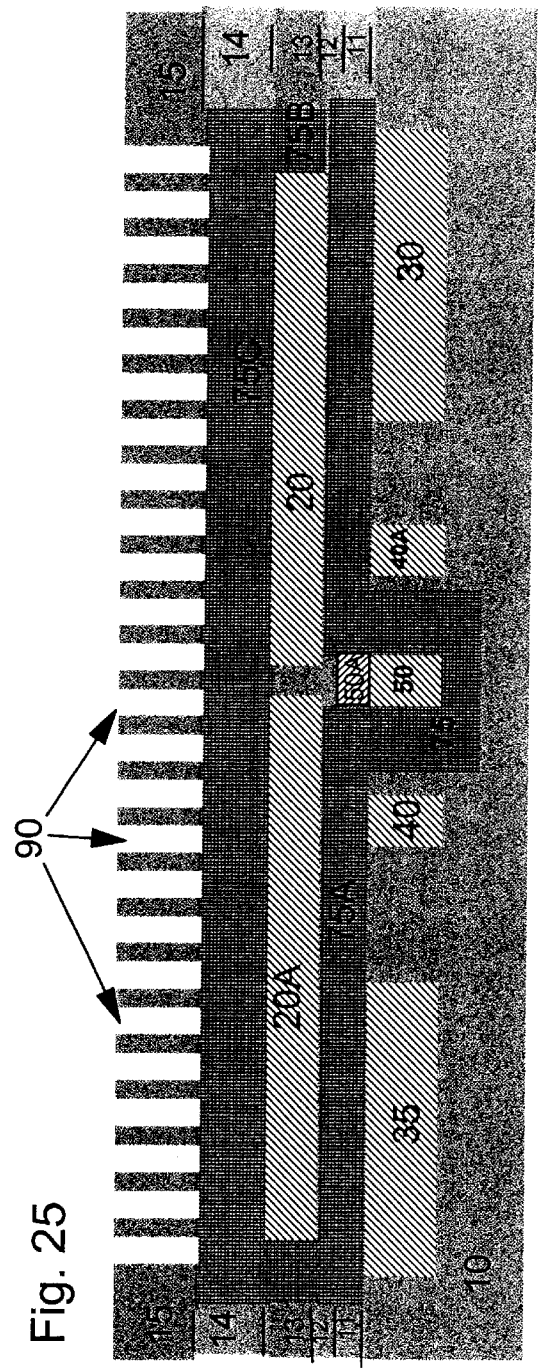

FIG. 25 illustrates the addition of dielectric layer 15 which is patterned and etched, using conventional semiconductor fabrication techniques, to form a plurality of small vias 90 through which the sacrificial material is released. At this point, upper contacts previously described with reference to FIG. 23B may also be incorporated. These upper contacts are fabricated in the same manner as the heretofor described Damascene metal contacts that are constructed along with their required wiring in dielectric layer 15. When incorporating these metal contacts, they should, preferably, be formed prior to the formation of the vias.

Figure 26:
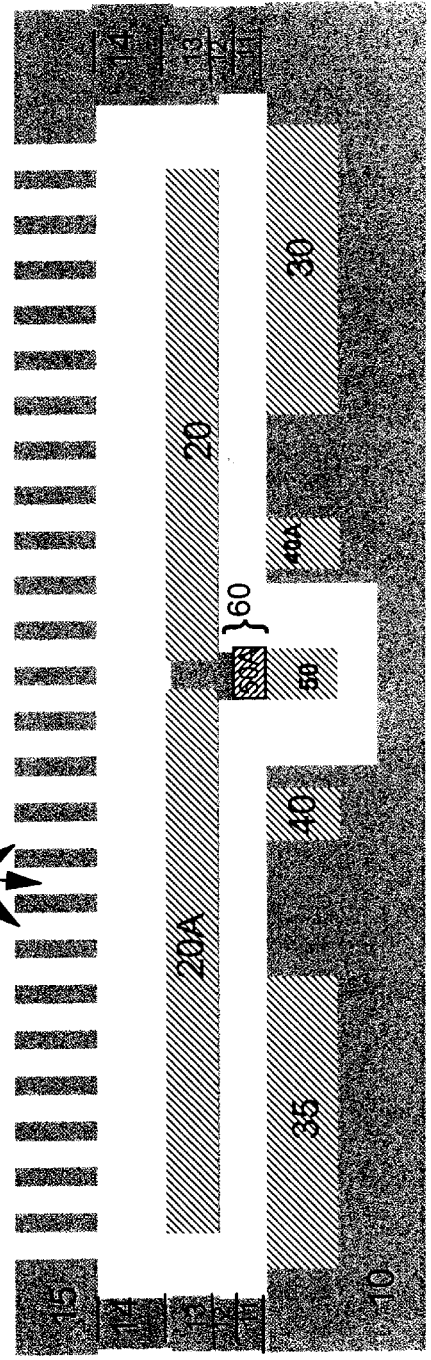
Figure 27:
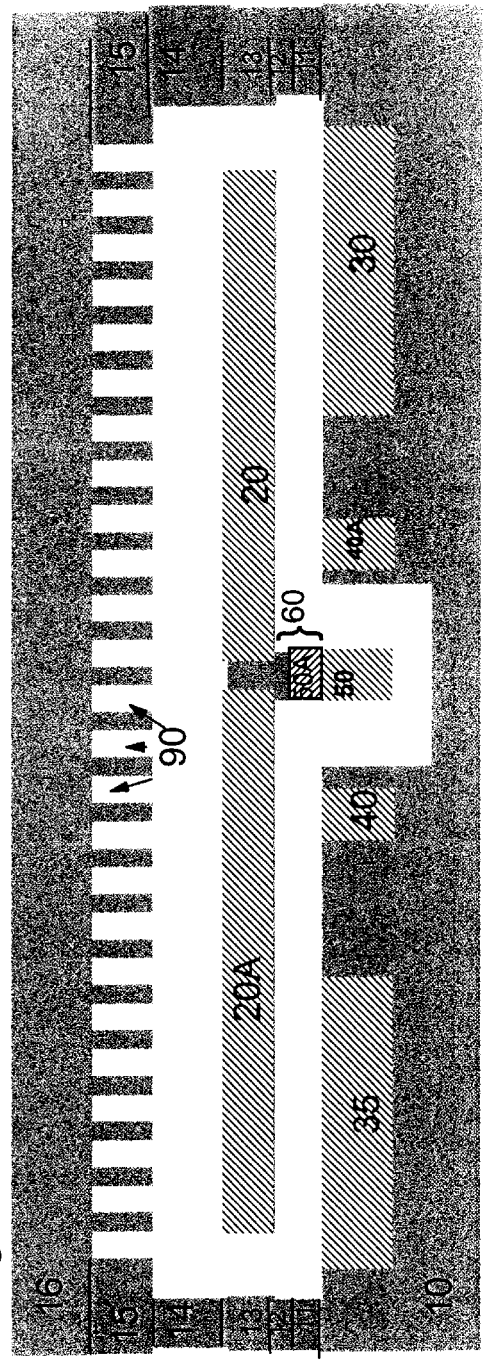

FIG. 26 shows the structure after releasing all of the sacrificial material, 75, 75A, 75B, and 75C. The material is released by exposing it to oxygen or hydrogen plasma which decomposes the material. Additional details may be found in a paper by A. Joshi and R. Nimmagadda entitled "Erosion of diamond films and graphite in oxygen plasma", Journal of Material Research., Vol. 6, No. 7, p. 1484, 1996, published by the Materials Research Society FIG. 27 depicts the encapsulation by the addition of another dielectric layer 16 which pinches off a plurality of small vias 90.

Figure 28A:
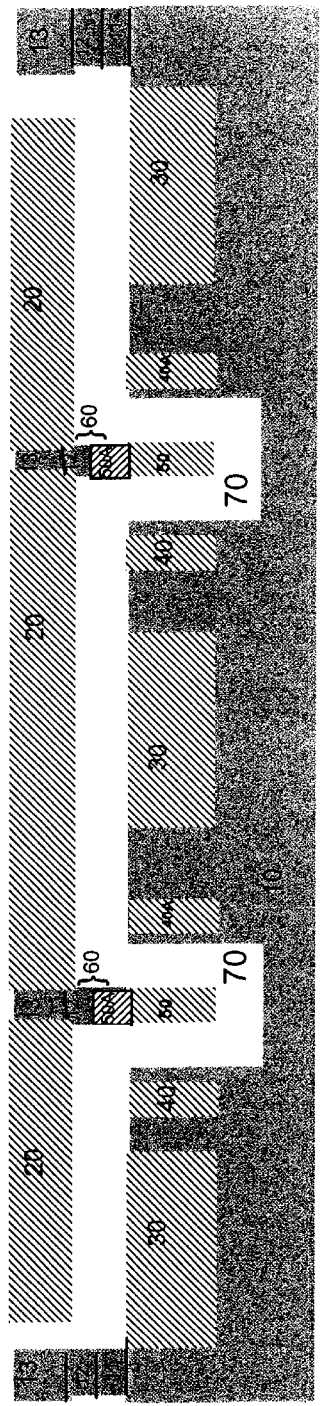
FIG. 28A illustrates the versatility of the MEM switch wherein by combining a plurality of elements, the switch is adaptable to operate under a combination of various functions.

FIG. 28A demonstrates versatility of the MEM switch wherein by combining a plurality of elements, the switch is adaptable to operate under a combination of various functions. Therein is shown multiple beams 60 and control electrodes 50, 40 and 40a providing multiple contacts and associated switching combinations.

Figure 28B:
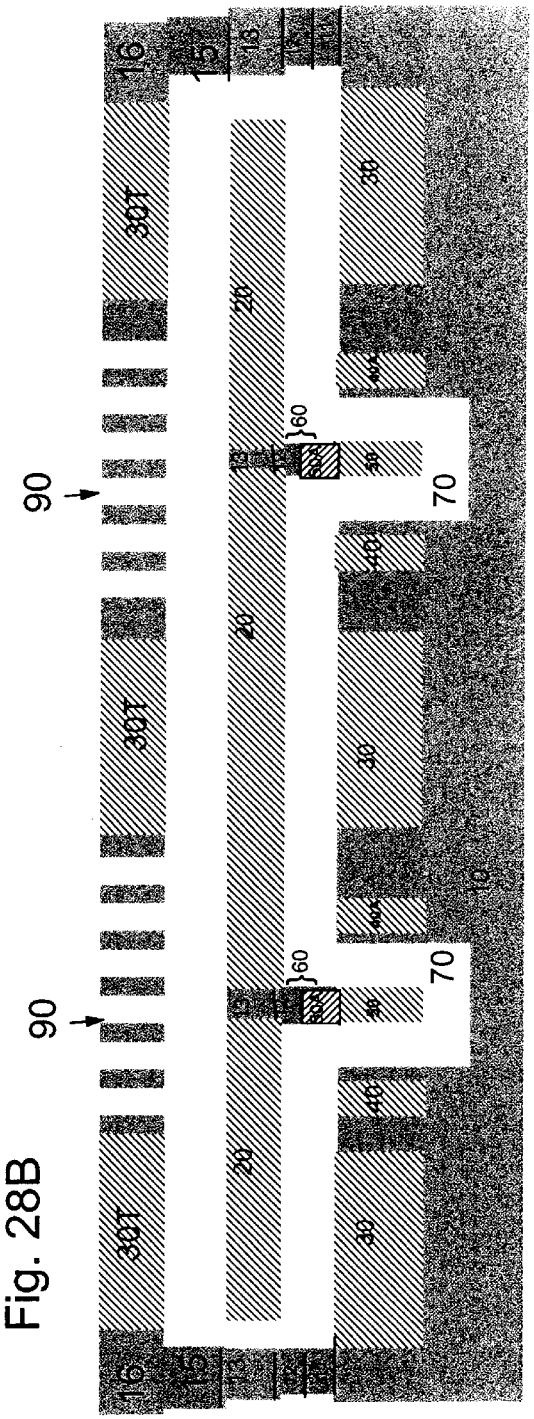
FIG. 28B shows the device depicted in FIG. 28A with the addition of upper contacts 30T to further enhance the functionality of the MEMS device.

FIG. 28B shows the device depicted in FIG. 28A with the addition of upper contacts 30T to further enhance the functionality of the MEMS device. This is further expounded upon in FIGS. 28C and 28D.

Figure 28C:
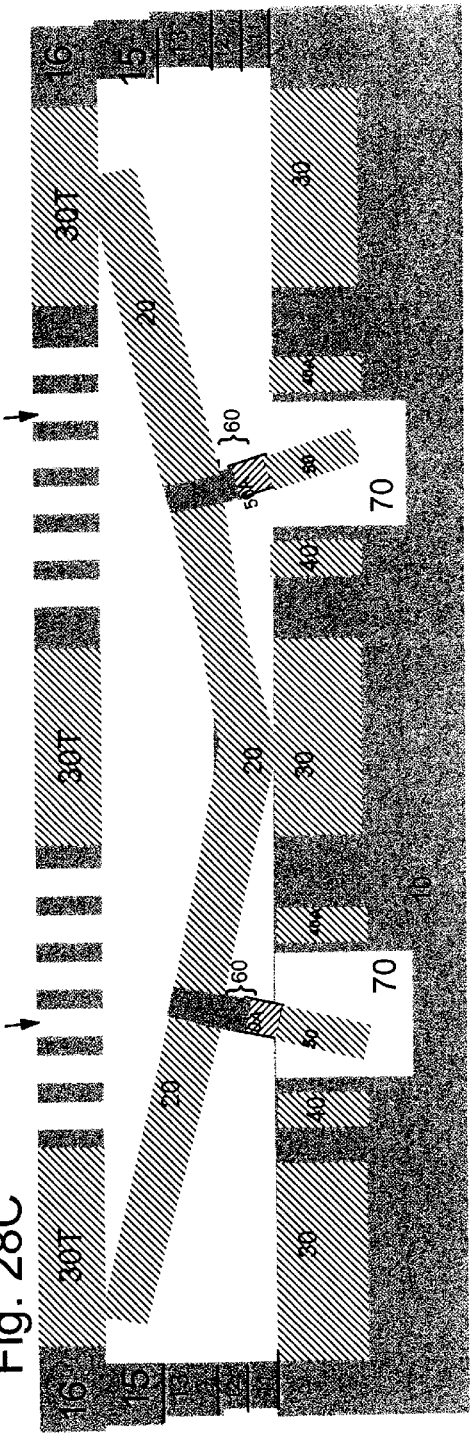
FIG. 28C shows how the movable contacts operate when the torsion beams are torqued in opposite directions, with contact being provided at three points.

FIG. 28C shows how the movable contacts 20 operate when the torsion beams are torqued in opposite directions. Contact is provided at three points. The complement of this arrangement operates in a similar manner, i.e., if the beams are torqued, the moveable control electrodes 50 will move towards each other and the ends of the movable contacts 20 will move downward. Accordingly, the middle of the movable contact 20 is deformed upwardly.

Figure 28D:
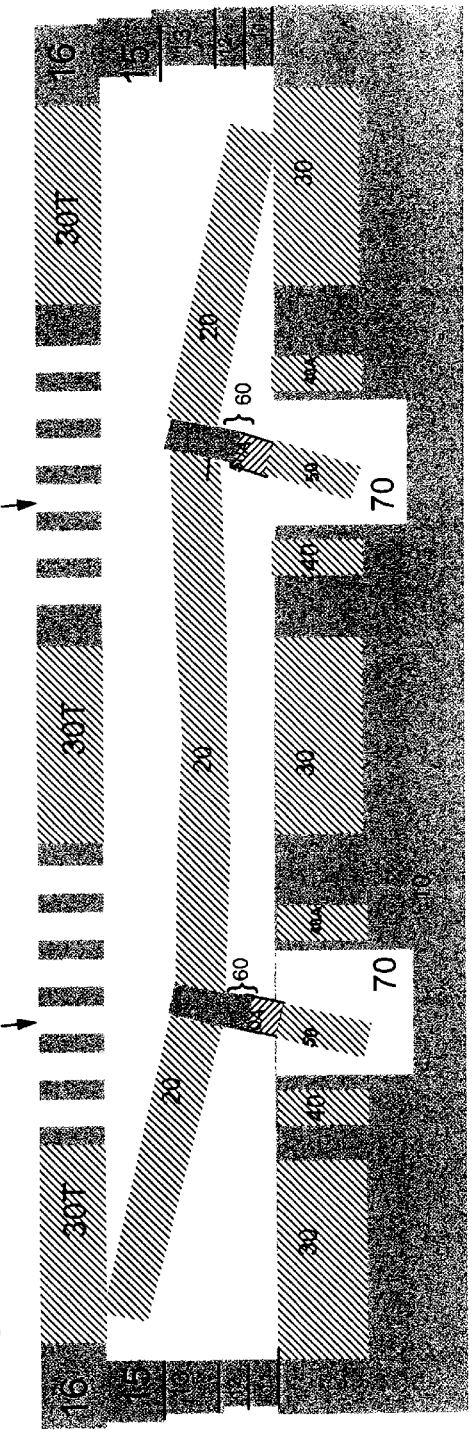
FIG. 28D illustrates how the contacts work when the torsion beams are torqued in the same direction.

FIG. 28D illustrates how the contacts work when the torsion beams are torqued in the same direction.

While the invention has been described in conjunction with a preferred embodiment, it is to be understood that many alternatives, modifications and variations will be apparent to those skilled in the art in light of the aforementioned description. Accordingly, it is intended to embrace all such alternatives, modifications and variations which fall within the spirit and scope of the appended claims. All matters set forth herein or shown in the accompanying drawings are to be interpreted in an illustrative and non-limiting sense.

What is claimed is:

1. A semiconductor micro electro-mechanical (MEM) switch comprising:
   a conductive movable control electrode;
   an insulated semiconductor torsion beam attached to said movable control electrode, said insulated torsion beam and said movable control electrode being parallel to each other; and
   at least one movable contact attached to said insulated torsion beam, wherein the combination of said insulated torsion beam and said control electrode is perpendicular to said at least one movable contact.

2. The MEM switch recited in claim 1 further comprising a stationary electrode parallel to said movable control electrode wherein a voltage applied between said movable said stationary and said movable control electrode creates an attraction force on said electrodes inducing a torque on said insulated torsion beam that causes said movable contact to move.

3. The MEM switch recited in claim 1 wherein air surrounds said movable contact electrode except for said attachment to said torsion beam.

4. The MEM switch recited in claim 1 further comprising a plurality of stationary contacts, wherein at least one of said stationary contacts provide a signal path between said at least one stationary contact and said moving contact, thereby forming a single pole, single throw (SPST) MEM switch.

5. The MEM switch recited in claim 4 wherein at least two of said stationary contacts provide a signal path between said stationary contact through said movable contact.

6. The MEM switch recited in claim 1 wherein at least three stationary contact provide a signal path between the movable contact and the three stationary contacts, thereby forming a double pole, double throw (DPST) MEM switch.

7. The MEM switch recited in claim 1, wherein said torsion beam is attached to at least one end of said movable contact.

8. The MEM switch recited in claim 1, wherein said movable contact is attached at a point located between the two ends of said movable contact.

9. The MEM switch recited in claim 1, wherein the torsion beam where the movable contact is positioned on opposite sides of said movable control electrode, said movable contact being perpendicular to said movable control, said two movable controls and said movable contact being electrically decoupled from each other by said torsion beam.

10. The MEM switch recited in claim 1, wherein said torsion beam is surrounded by air except a) at the two ends which are anchored to the surrounding insulator, b) at the connection between the torsion beam and the movable control electrode, and c) between the torsion beam and the movable contact electrode.

* * * * *